United States Patent
Lo et al.

(10) Patent No.: US 10,692,558 B2
(45) Date of Patent: Jun. 23, 2020

(54) MEMORY DEVICE AND REFRESH INFORMATION COHERENCE METHOD THEREOF

(71) Applicant: Industrial Technology Research Institute, Hsinchu (TW)

(72) Inventors: Chih-Yen Lo, Hsinchu (TW); Jenn-Shiang Lai, Miaoli County (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 16/231,869

(22) Filed: Dec. 24, 2018

(65) Prior Publication Data
US 2020/0135255 A1    Apr. 30, 2020

(30) Foreign Application Priority Data
Oct. 24, 2018   (TW) .............................. 107137451 A (51) Int. Cl.
G11C 11/24    (2006.01)
G11C 11/403    (2006.01)
G11C 11/406    (2006.01)

(52) U.S. Cl.
CPC ...... *G11C 11/403* (2013.01); *G11C 11/40615* (2013.01)

(58) Field of Classification Search
CPC ........................ G11C 11/403; G11C 11/40615
USPC ......................................................... 365/149
See application file for complete search history.

(56) References Cited

U.S. PATENT DOCUMENTS

| | | |
|---|---|---|
| 5,511,033 A | 4/1996 | Jung |
| 5,583,823 A | 12/1996 | Park |
| 6,587,918 B1 | 7/2003 | Christenson |
| 6,934,211 B2 | 8/2005 | Hazama et al. |
| 6,948,029 B2 | 9/2005 | Yano |
| 7,295,484 B2 | 11/2007 | Cruz et al. |

(Continued)

FOREIGN PATENT DOCUMENTS

| | | |
|---|---|---|
| TW | I224337 B | 11/2004 |
| TW | I294077 B | 3/2008 |

(Continued)

OTHER PUBLICATIONS

Taiwan Patent Office, Notice of Allowance, Patent Application Serial No. 107137451, dated Jul. 12, 2019, Taiwan.

(Continued)

*Primary Examiner* — Vu A Le (57) ABSTRACT

A memory device includes a memory with a plurality of memory blocks and a first storage circuit to store a first data table and a first refresh value, and a memory controller with a second storage circuit to store a second data table and a second refresh value. When the memory controller meets a refresh request, the memory controller reads the second refresh value and compares the corresponding access address to the corresponding bit in the second data table to determine whether valid data are stored in a specific memory block of the memory. The memory controller sends a valid-data refresh command to the memory when valid data are stored in the specific memory block, but sends an invalid-data refresh command to the memory when invalid data are stored in the specific memory block.

16 Claims, 4 Drawing Sheets

(56) References Cited

U.S. PATENT DOCUMENTS

| | | | |
|---|---|---|---|
| 8,631,194 B2 | 1/2014 | Wakasa | |
| 9,058,896 B2 | 6/2015 | Franceschini et al. | |
| 2014/0211579 A1 | 7/2014 | Lovelace | |
| 2016/0179613 A1* | 6/2016 | Suto | G06F 11/1048 |
| | | | 714/773 |
| 2016/0283150 A1* | 9/2016 | Kogita | G11C 16/3431 |
| 2019/0155764 A1* | 5/2019 | Lo | G06F 13/1689 |

FOREIGN PATENT DOCUMENTS

| | | |
|---|---|---|
| TW | 201234188 A | 8/2012 |
| TW | 200305077 A | 10/2013 |
| TW | 201426305 A | 7/2014 |
| TW | 201510999 A | 3/2015 |
| TW | I519953 B | 2/2016 |
| TW | 201732617 A | 9/2017 |

OTHER PUBLICATIONS

Low Power Double Date Rate 4(LPDDR4), JESD209-4B (Revision of JESD209-4A, Nov. 2015), Jedec Solid State Technology Association, Solid State Technology Association. Feb. 2017, USA.

* cited by examiner

FIG. 4

MEMORY DEVICE AND REFRESH INFORMATION COHERENCE METHOD THEREOF

CROSS REFERENCE TO RELATED APPLICATIONS

This application claims priority of and the benefit of Taiwan Application No. 107137451, filed Oct. 24, 2018.

TECHNICAL FIELD

The present disclosure relates to a memory device, and to a memory device refresh information coherence method.

BACKGROUND

Dynamic random access memory (DRAM) is used in a variety of electronic devices. DRAM is a kind of volatile memory. In other words, DRAM may lose its data storage status when the power is turned off. A DRAM cell saves data by storing charges on its capacitor, and the charges on the capacitor may gradually decay over time, so that it needs refresh periodically in order to maintain the validity of internal data.

The refresh operation not only increases power consumption of a memory, but also prohibits the system to access the memory. The system becomes idle and waits until the refresh operation is finished, which results in low computing efficiency. As memory capacity increases continuously, the refresh time of the memory block is also increasing. The memory itself cannot determine the validity of internal data in its memory blocks, thus the memory needs to communicate with a memory controller to update information about the validity of internal data in its memory blocks in time.

SUMMARY

In order to resolve the issue described above, the present disclosure discloses a memory device and a refresh information coherence method thereof.

An embodiment of the present disclosure discloses a memory device comprising a memory having a plurality of memory blocks and a first storage circuit; and a memory controller having a second storage circuit. The first storage circuit stores a first data table and a first refresh value. The second storage circuit stores a second data table and a second refresh value. The first refresh value and the second refresh value correspond to an access address at which the memory controller triggers the memory to refresh its data when meeting a refresh request, and the access address corresponds to a specific memory block that is located among the plurality of memory blocks. The first data table and the second data table both have a plurality of bits. Each of the bits represents whether the corresponding memory block stores valid data or not. When the memory controller meets a refresh request, the memory controller reads the second refresh value and compares the corresponding access address to the corresponding bit in the second data table to determine whether the specific memory block of the memory stores the valid data. When the valid data are stored in the specific memory block, the memory controller sends a valid-data refresh command to the memory. When invalid data are stored in the specific memory block, the memory controller sends an invalid-data refresh command to the memory.

An embodiment of the present disclosure discloses a memory device control method to synchronize a first data table in a memory and a second data table in a memory controller. The memory has a plurality of memory blocks and a first storage circuit which stores a first data table and a first refresh value. The memory controller has a second storage circuit which stores a second data table and a second refresh value. The first refresh value and the second refresh value correspond to an access address at which the memory controller triggers the memory to refresh its data when meeting a refresh request, and the access address corresponds to a specific memory block that is located among the plurality of memory blocks. The first data table and the second data table both have a plurality of bits, and each of the bits represents whether the corresponding memory block stores valid data or not. The method comprises operations performed by the memory controller: reading the second refresh value and comparing the corresponding access address to the corresponding bit in the second data table to determine whether the specific memory block of the memory stores the valid data when the memory controller meets a refresh request, sending a valid-data refresh command to the memory when the valid data are stored in the specific memory block, and sending an invalid-data refresh command to the memory when invalid data are stored in the specific memory block.

DETAILED DESCRIPTION OF DISCLOSURE

During a system computing, data stored in the memory blocks are not always valid, and therefore the blocks of a memory do not need refresh in each refresh request. By ignoring the refresh of the memory blocks that store invalid data, the available access time of the memory can be extended, and under the promise of maintaining integrity of the data, the average data bandwidth provided by the memory and the overall system computing performance may increase at the same time.

The present disclosure provides a mechanism for transmitting data-validity information from the memory controller to the memory, so that the memory can timely update information about the data validity of its internal memory blocks. In this case, the refresh of the memory blocks with invalid data is prohibited, and the possibility of the memory being prohibitively accessed due to the invalid-data refresh may decrease.

Figure 1:
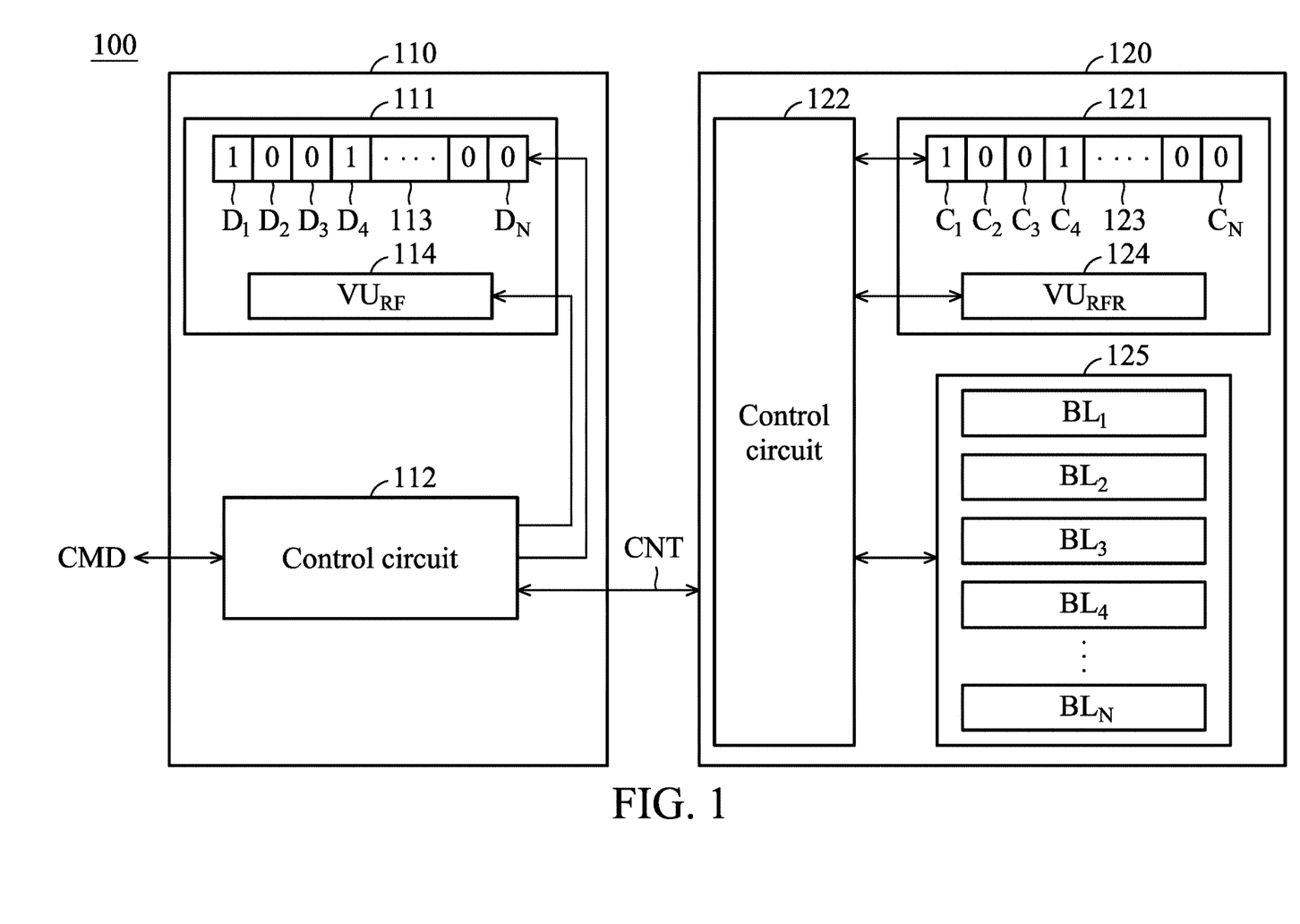
FIG. 1 is a block diagram of a memory device in accordance with an embodiment of the disclosure.

FIG. 1 is a block diagram of a memory device in accordance with an embodiment of the disclosure. As shown in FIG. 1, the memory device 100 comprises a memory controller 110 and a memory 120. The memory controller 110 receives an external command CMD, and generates a control command CNT according to the external command CMD. The memory 120 receives external data from the memory controller 110 or provides the read data from its internal memory blocks to the memory controller 110. In some embodiments, the external command CMD is provided by an external circuit (not shown), for example, the external circuit may be a CPU of a device. The memory controller 110 outputs the read data to the external circuit, wherein the external circuit is arranged outside the memory controller 110 and the memory 120.

In an embodiment, memory 120 is a dynamic random access memory (DRAM). In the embodiment, memory 120 includes a control circuit 122 and a memory array 125. The control circuit 122 writes external data into the memory array 125 according to the control command CNT from the memory controller 110, or reads the data stored in the memory array 125 according to the control command CNT and then sends the read data to the memory controller 110. As shown in FIG. 1, the memory array 125 includes memory blocks $BL_1 \sim BL_N$ to store data. Each of the memory blocks $BL_1 \sim BL_N$ has a plurality of storage unit (also called as memory cells).

In the embodiment, the memory controller 110 includes a second storage circuit 111 and a control circuit 112. The second storage circuit 111 stores a second data table 113 and a second refresh value $VU_{RF}$. The second data table 113 has bits $D_1 \sim D_N$. A value in each of the bits $D_1 \sim D_N$ represents whether the corresponding memory block stores valid data or not. For example, bits $D_1 \sim D_N$ respectively corresponds to the memory blocks $BL_1 \sim BL_N$ of the memory 120. In this example, the values of bit $D_1$ and bit $D_4$ are "1", which means that memory block $BL_1$ and memory block $BL_4$ store valid data. And the values of bit $D_2$ and bit $D_3$ are "0", which means that memory block $BL_2$ and memory block $BL_3$ do not store any data or they store invalid data. The present disclosure does not limit bit quantity in the second data table 113. In some embodiments, the bit quantity of the second data table 113 is relative to memory block quantity of the memory 120. In an initial mode, the control circuit 112 sets initial values to the bits $D_1 \sim D_N$, such as "0".

In other embodiments, the memory controller 110 further includes a timing circuit (not shown) to determine whether the memory controller 110 meets a refresh request and to trigger the control circuit 112 into a refresh mode. For example, when the timing circuit meets a pre-determined value, which means that the memory controller 110 has met a refresh request, and the timing circuit sends out a trigger signal. The control circuit 112 enters a refresh mode according to the trigger signal. While in the refresh mode, the control circuit 112 selects at least one specific memory block from the memory blocks $BL_1 \sim BL_N$ of the memory 120 according to the second refresh value $VU_{RF}$, and determines whether the specific memory block stores valid data according to the second data table 113.

The memory 120 in FIG. 1 further includes a first storage circuit 121. In the embodiment, the first storage circuit 121 stores a first data table 123 and a first refresh value $VU_{RFR}$. The first data table 123 has bits $C_1 \sim C_N$. Bits $C_1 \sim C_N$ respectively represent whether the corresponding memory blocks $BL_1 \sim BL_N$ store valid data or not. In the embodiment, the second refresh value $VU_{RF}$ is stored in a refresh address register 114 of the memory controller 110, and the first refresh value $VU_{RFR}$ is stored in a refresh address register 124 of the memory 120. The second refresh value $VU_{RF}$ and the first refresh value $VU_{RFR}$ represent a refresh sequence, which is the sequence of performing refresh operation to the memory blocks $BL_1 \sim BL_N$. The control circuit 112 of the memory controller 110 determines to refresh which of the memory blocks according to the second refresh value $VU_{RF}$.

The control circuit 122 of the memory 120 determines to refresh which of the memory blocks according to the first refresh value $VU_{RFR}$.

In other embodiments, the memory controller 110 further includes a counter (not shown). The counter has a count value, which is served as the second refresh value $VU_{RF}$. In this example, the control circuit 112 selects at least one memory block to be refreshed according to the count value of the counter. After reading the count value of the counter, the control circuit 112 changes the count value of the counter, such as increasing or decreasing the count value. In some embodiments, when the control circuit 112 operates in the refresh mode, the control circuit 112 changes the count value no matter whether the control circuit 112 sends a valid-data refresh command to the memory 120. In general, the second refresh value $VU_{RF}$ of the memory controller 110 is synchronized with the first refresh value $VU_{RFR}$ of the memory 120.

For example, when the memory controller 110 meets a refresh request, the control circuit 112 selects memory block $BL_4$ according to the second refresh value $VU_{RF}$. In this example, the control circuit 112 compares with the corresponding bit $D_4$ in the second data table 113 to determine whether the memory block $BL_4$ stores valid data. If the value of the bit $D_4$ is "1", which means that the memory block $BL_4$ stores valid data, the control circuit 112 sends the control command CNT with a valid-data refresh command. According to the valid-data refresh command, the control circuit 122 of the memory 120 reads the first refresh value $VU_{RFR}$, and selects the corresponding memory block $BL_4$ to perform a refresh operation. In some embodiments, the control circuit 122 performs a refresh operation by reading the data stored in the memory block $BL_4$ and then storing the data back to the memory block $BL_4$ again. When the control circuit 122 refreshes the memory block $BL_4$, the control circuit 112 does not send any commands to the memory 120. After the control circuit 122 finishes the refresh operation, the control circuit 112 sends out other control commands again. Then, the memory 120 accesses the memory block $BL_1 \sim BL_N$ according to the control command CNT.

In another embodiment, when the memory controller 110 meets a refresh request, the control circuit 112 selects the memory block $BL_3$ according to the second refresh value $VU_{RF}$. The control circuit 112 compares with the corresponding bit $D_3$ in the second data table 113 to determine whether the memory block $BL_3$ stores valid data. Because the value of the bit $D_3$ is "0", which means the memory block $BL_3$ does not store any data or stores invalid data, the control circuit 112 sends out the control command CNT with an invalid-data refresh command. According to the invalid-data refresh command, the control circuit 122 of the memory 120 reads the first refresh value $VU_{RFR}$ and selects the corresponding memory block $BL_3$. It does not refresh the memory block $BL_3$, but sets the corresponding bit $C_3$ in the first data table 123 as invalid value (such as "0"). In this case, the value of the bit $C_3$ in the first data table 123 is synchronized with the value of the bit $D_3$ in the second data table 113 (both are "0"). Furthermore, because the control circuit 122 does not refresh the memory block $BL_3$, after a clock cycle, the control circuit 122 may access the memory blocks $BL_1 \sim BL_N$ according to the command CNT from the memory controller 110. Thus, the performance of the memory device 100 may substantially increase by prohibiting the invalid-data refresh operation.

The control circuit 122 of the memory 120 determines that a refresh command is a valid-data refresh command or an invalid-data refresh command by the setting of one or more redundant bits in the conventional refresh command. For example, if the a second bit of the original refresh command is not used in the conventional art, the valid-data refresh command may be defined by setting the second bit of the conventional refresh command to be "1". In contrary, the invalid-data refresh command may be defined by setting the second bit of the conventional refresh command to be "0". The control circuit 122 implements the corresponding operation in accordance with the setting of the valid-data or the invalid-data refresh command.

In the embodiment, the external command CMD may be a write command, a read command, an eviction command, a flush command or other commands. When the external command CMD is a write command to write data into the memory block $BL_1$ as an example, the control circuit 112 of the memory controller 110 responds to the write command CMD and sets the corresponding bit (the bit $D_1$ in FIG. 1) in the second data table 113 as valid ("1") according to the write address for the memory block $BL_1$, and then sends the write command CNT to the memory 120. When receiving the write command CNT, the control circuit 122 of the memory 120 sets the corresponding bit (the bit $C_1$ in FIG. 1) in the first data table 123 as valid ("1") according to the write address, and writes the data to the corresponding memory block $BL_1$. Therefore, the value of the corresponding bit $C_1$ in the first data table 123 is synchronized with the corresponding bit $D_1$ in the second data table 113.

In another embodiment, when the external command CMD is a write command to write data into the memory block $BL_1$ as an example, the control circuit 112 of the memory controller 110 responds to the write command CMD and sets the corresponding bit (the bit $D_1$ in FIG. 1) in the second data table 113 as valid ("1") according to the write address for the memory block $BL_1$, and then sends the write command CNT to the memory 120. When receiving the write command CNT, the control circuit 122 of the memory 120 only writes the data to the corresponding memory block $BL_1$ according to the write address, but does not set the corresponding bit (the bit $C_1$ in FIG. 1) in the first data table 123 as valid ("1"). After that, when the memory controller 110 meets a refresh request to refresh the memory block $BL_1$, the control circuit 112 of the memory controller 110 reads the second refresh value $VU_{RF}$ and compares with the corresponding bit $D_1$ in the second data table 113 to determine whether the memory block $BL_1$ stores valid data. Because the corresponding bit $D_1$ is updated as valid ("1") by the previous write command, the control circuit 112 determines that the memory block $BL_1$ stores the valid data, and then sends a valid-data refresh command to the memory 120. After receiving a valid-data refresh command, the control circuit 122 of the memory 120 sets the corresponding bit (the bit $C_1$ in FIG. 1) in the first data table 123 as valid ("1") and refreshes the memory block $BL_1$. Therefore, the value of the corresponding bit $C_1$ in the first data table 123 is synchronized with the corresponding bit $D_1$ in the second data table 113.

In some embodiments, when the external command CMD is a read command to read data stored in the memory block $BL_4$ as an example, the control circuit 112 of the memory controller 110 responds to the read command CMD and sends the read command CNT to the memory 120 according to the read address for the memory block $BL_4$. However, it does not change the setting of the corresponding bit (the bit $D_4$ in FIG. 1) in the second data table 113. After receiving the read command CNT, the control circuit 122 of the memory 120 reads the memory block $BL_4$ according to the read address, and does not change the setting of the corresponding bit (the bit $C_4$ in FIG. 1) in the first data table 123.

In some embodiments, when the external command CMD is an eviction command for evicting data stored in the memory block $BL_2$ (that is, removing the data stored in the memory block $BL_2$) as an example, the control circuit 112 of the memory controller 110 responds to the eviction command CMD and sets the corresponding bit (the bit $D_2$ in FIG. 1) in the second data table 113 as invalid ("0") according to the eviction address for the memory block $BL_2$. Meanwhile, the control circuit 122 of the memory 120 does not set the corresponding bit (the bit $C_2$ in FIG. 1) in the first data table 123 as invalid ("0"). After that, when the memory controller 110 meets a refresh request to refresh the memory block $BL_2$, the control circuit 112 of the memory controller 110 reads the second refresh value $VU_{RF}$ and compares with the corresponding bit $D_2$ to determine whether the memory block $BL_2$ stores valid data. Because the corresponding bit $D_2$ is updated as invalid ("0") by the previous eviction command, the control circuit 112 determines that the memory block $BL_2$ does not store any data or it stores invalid data, and then sends an invalid-data refresh command to the memory 120. After receiving an invalid-data refresh command, the control circuit 122 of the memory 120 sets the corresponding bit (the bit $C_2$ in FIG. 1) in the first data table 123 as invalid ("0"). Therefore, the value of the corresponding bit $C_2$ in the first data table 123 is synchronized with the corresponding bit $D_2$ in the second data table 113. Furthermore, because the control circuit 122 does not refresh the memory block $BL_2$, after a clock cycle, the control circuit 122 may access the memory blocks $BL_1$~$BL_N$ according to the command CNT from the memory controller 110. Thus, the performance of the memory device 100 may substantially increase by prohibiting the invalid-data refresh operation.

In some embodiments, when the external command CMD is a flush command for flushing data stored in the memory block $BL_3$ (that is, reading the data stored in the memory block $BL_3$, copying the data to an external storage device, and removing the data in the memory block $BL_3$) as an example, the control circuit 112 of the memory controller 110 responds to the flush command CMD and sets the corresponding bit (the bit $D_3$ in FIG. 1) in the second data table 113 as invalid ("0") according to the flush address for the memory block $BL_3$, and then sends a read command CNT to the memory 120. After receiving the read command CNT, the control circuit 122 of the memory 120 reads the memory block $BL_3$ according to the flush address, so that the data can be copied to the external storage device. After that, when the memory controller 110 meets a refresh request to refresh the memory block $BL_3$, the control circuit 112 of the memory controller 110 reads the second refresh value $VU_{RF}$ and compares with the corresponding bit $D_3$ to determine whether the memory block $BL_3$ stores valid data. Because the corresponding bit $D_3$ is updated as invalid ("0") by the previous flush command, the control circuit 112 determines that the memory block $BL_3$ does not store any data or it stores invalid data, and then sends an invalid-data refresh command to the memory 120. After receiving an invalid-data refresh command, the control circuit 122 of the memory 120 sets the corresponding bit (the bit $C_3$ in FIG. 1) in the first data table 123 as invalid ("0"). Therefore, the value of the corresponding bit $C_3$ in the first data table 123 is synchronized with the corresponding bit $D_3$ in the second data table 113. Furthermore, because the control circuit 122 does not refresh the memory block $BL_3$, after a clock cycle, the control circuit 122 may access the memory blocks $BL_1 \sim BL_N$ according to the command CNT from the memory controller 110. Thus, the performance of the memory device 100 may substantially increase by prohibiting the invalid-data refresh operation.

Figure 2:
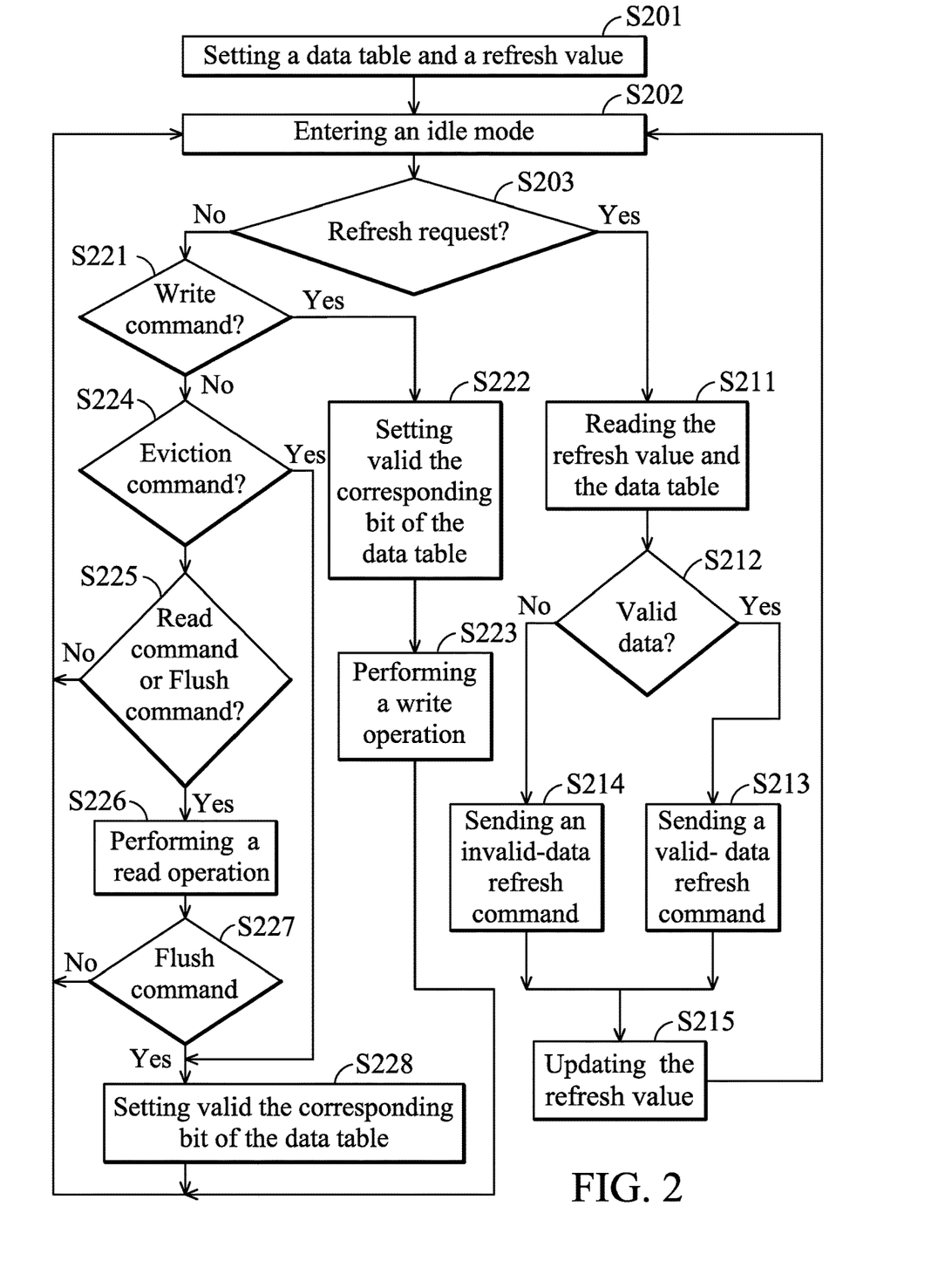
FIG. 2 is a flow chart of a control method for a memory controller 110 in accordance with the embodiment of the disclosure.

FIG. 2 is a flow chart of a control method for a memory controller 110 in accordance with the embodiment of the disclosure. In the embodiment, in step S201, the second data table 113 of the memory controller 110 is set or reset to an initial value, such as "0". In other embodiments, in step S201, a second refresh value $VU_{RF}$ is further written to the memory controller 110. In other embodiments, when the memory controller 110 includes a counter, in step S201, the counter is reset to an initial value which is served as a second refresh value $VU_{RF}$.

Then, the memory controller 110 enters an idle mode (step S202). While in the idle mode, the memory controller 110 waits for an external command CMD (such as a write command, an eviction command, a read command, or a flush command), and determines whether a refresh request is met or not (step S203). When a refresh request is met, steps S211~S215 are implemented. In the embodiment, after implementing step S215, the memory controller 110 enters an idle mode (step S202) again.

When the refresh request is met, the memory controller 110 reads the second refresh value $VU_{RF}$ and compares with the corresponding bit in the second data table 113 (step S211) to determine whether a specific memory block of the memory 120 stores valid data (step S212). For example, as shown in FIG. 1, when the memory controller 110 meets a refresh request, the memory block $BL_3$ is selected according to the second refresh value $VU_{RF}$, thus the memory controller 110 compares with the corresponding bit $D_3$ in the second data table 113 to determine whether the memory block $BL_3$ stores valid data. When the value of the bit $D_3$ is "1", the memory block $BL_3$ stores the valid data. When the value of the bit $D_3$ is "0", the memory block $BL_3$ does not store any data or stores invalid data.

When the memory controller 110 determines that the specific memory block in the memory 120 stores the valid data, the memory controller 110 sends a valid-data refresh command CNT to the memory 120 (step S213). When the memory controller 110 determines that the specific memory block in the memory 120 does not store any data or stores invalid data, the memory controller 110 sends an invalid-data refresh command to the memory 120 (step S214).

Then, the second refresh value $VU_{RF}$ is updated (step S215) to select another memory block when the memory controller 110 meets the next refresh request. In an exemplary embodiment, the memory controller 110 may include a counter. A count value of the counter is served as a second refresh value $VU_{RF}$. In this example, in step S211, the count value of the counter is read. The memory controller 110 selects the corresponding memory block according to the count value of the counter. In the exemplary embodiment, the memory controller 110 change the count value of the counter (step S215) when meets a refresh request. When the next refresh request is met, the memory controller 110 selects another memory block according to the count value that has been changed previously. The present disclosure does not limit how the memory controller 110 changes the count value. In the possible embodiment, the memory controller 110 may increase or decrease the count value. After finishing the updating of the second refresh value $VU_{RF}$, the memory controller 110 returns to an idle mode (step S202) again.

However, when the memory controller 110 does not meet the refresh requirement but receives the external command CMD, the memory controller 110 accesses the memory 120 in accordance with the external command CMD. In step S221, the memory controller 110 determines whether the external command CMD is a write command. If yes, the memory controller 110 enters a write mode and sets the corresponding bit in the second data table 113 as valid ("1") (step S222) according to the write address, and then performs a write operation (steps S223). For example, if the write command CMD is for writing data into the memory block $BL_1$ of FIG. 1, the memory controller 110 responds to the write command CMD and sets the corresponding bit (the bit $D_1$ in FIG. 1) in the second data table 113 as valid ("1"), and then performs a write operation to the memory block $BL_1$. After finishing the write operation, the memory controller 110 returns to an idle mode (step S202) again, and then waits for the next external command CMD or the next refresh request.

When the external command CMD is not a write command, the memory controller 110 determines whether the external command CMD is an eviction command (step S224). If yes, the memory controller 110 responds to the eviction command and sets the corresponding bit in the second data table 113 as invalid ("0") (step S228) according to the eviction address. For example, if the eviction command is for evicting data stored in the memory block $BL_2$, the memory controller 110 responds to the eviction command and sets the corresponding bit (the bit $D_2$ in FIG. 1) in the second data table 113 as invalid ("0") according to the eviction address for the memory block $BL_2$. After finishing the eviction operation, the memory controller 110 returns to an idle mode (step S202) again, and then waits for the next external command CMD or the next refresh request.

When the external command CMD is not an eviction command, the memory controller 110 determines whether the external command CMD is a read command or a flush command (step S225). If the external command CMD is neither a read command nor a flush command, the memory controller 110 enters an idle mode (step S202) again. If the external command CMD is a read command or a flush command, the memory controller 110 performs a read operation (step S226). When performing the read operation, the memory controller 110 reads at least one memory block of the memory 120.

Then, the memory controller 110 determines whether the external command CMD is a flush command (step S227). When the external command CMD is not a flush command, the memory controller 110 returns to an idle mode (step S202) again. However, when the external command CMD is a flush command, the data stored in the specific memory block are copied to an external storage device (such as hard drive). Therefore, the memory controller 110 enters a flush mode, and sets the corresponding bit in the second data table 113 as invalid ("0") (step S228) according to the flush address. After that, the memory controller 110 returns to an idle mode (step S202) again.

Figure 3:
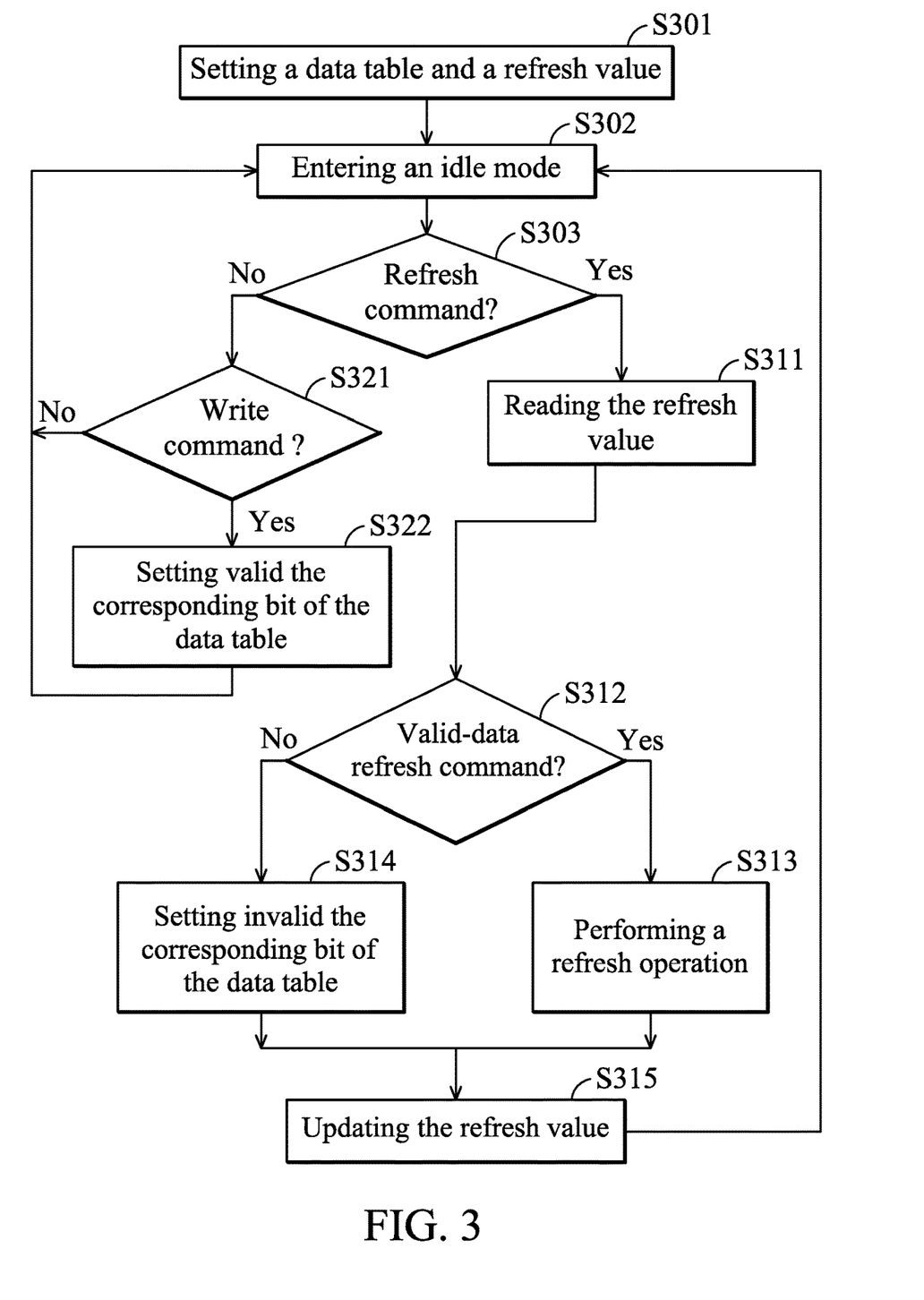
FIG. 3 is a flow chart of a memory 120 for controlling a first storage circuit 121 in accordance with the embodiment of the disclosure.

FIG. 3 is a flow chart of a memory 120 for controlling a first storage circuit 121 in accordance with the embodiment of the disclosure. In the embodiment, in step S301, the first data table 123 of the memory 120 is set or reset to an initial value, such as "0". In other embodiments, in step S301, a first refresh value $VU_{RFR}$ is written to the memory 120. In other embodiments, when the memory 120 includes a counter, in step S301, the counter is reset to an initial value which is served as a first refresh value $VU_{RFR}$.

Then, the memory 120 enters an idle mode (step S302). While in the idle mode, the memory 120 waits for other control commands CNT (such as a write command or a read command) or a refresh command from the memory controller 110. When the memory 120 receives a refresh command (step S303), steps S311~S315 are implemented. In the embodiments, after implementing the step S315, the memory 120 returns to an idle mode (step S302) again.

When the memory 120 receives a refresh command from the memory controller 110, the memory 120 first reads the first refresh value $VU_{RFR}$ (step S311), and retrieves a corresponding access address. Then, the memory 120 determines that the received refresh command is a valid-data refresh command or an invalid-data refresh command (step S312). When the received refresh command is a valid-data refresh command, the memory 120 directly refreshes the specific memory block corresponding to the access address (step S313). When the received refresh command is an invalid-data refresh command, the memory sets the corresponding bit in the first data table 123 as invalid ("0") (step S314) according to the access address. Then, the first refresh value $VU_{RFR}$ is updated (step S315) to select other memory blocks when the memory 120 receives the next refresh command. After updating the first refresh value $VU_{RFR}$, the memory 120 returns to an idle mode (step S302) again.

However, when the memory 120 has not yet received a refresh command, but it has received other control commands, the memory 120 determines whether the control command is a write command (step S321). When the control command is a write command, the memory 120 sets the corresponding bit in the first data table 123 as valid ("1") (step S322) according to the write address. After that, the memory 120 enters an idle mode (step S302) again. When the control command is not a write command, the setting of the corresponding bit in the first data table 123 does not change, and the memory 120 returns directly to an idle mode (step S302).

Figure 4:
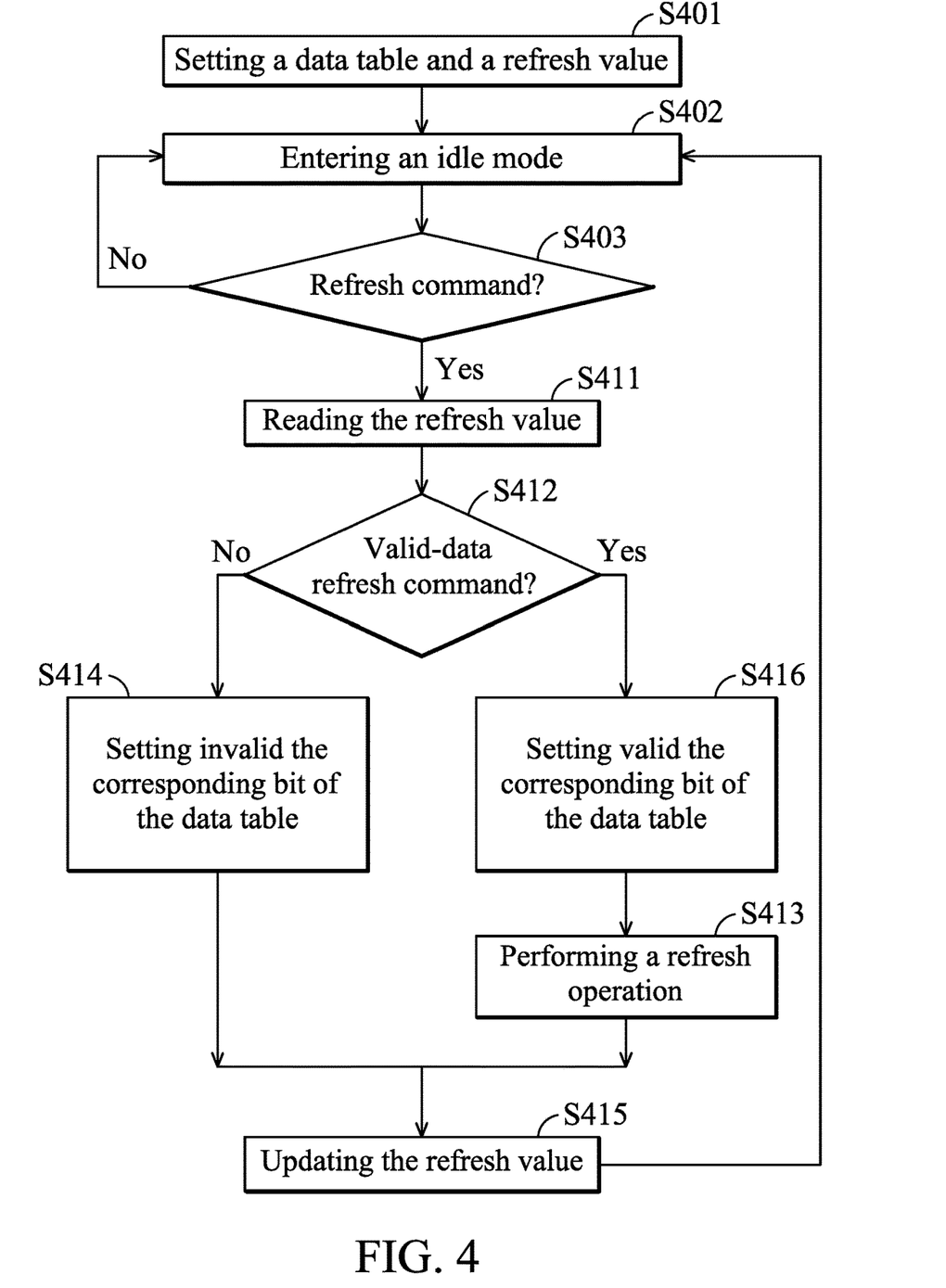
FIG. 4 is a flow chart of a memory 120 for controlling a first storage circuit 121 in accordance with another embodiment of the disclosure.

FIG. 4 is a flow chart of a memory 120 for controlling a first storage circuit 121 in accordance with another embodiment of the disclosure. In the embodiment, in step S401, the first data table 123 of the memory 120 is set or reset to an initial value, such as "0". In other embodiments, in step S401, a first refresh value $VU_{RFR}$ is written to the memory 120. In other embodiments, when the memory 120 includes a counter, in step S401, the counter is reset an initial value which is served as a first refresh value $VU_{RFR}$.

Then, the memory 120 enters an idle mode (step S402). While in the idle mode, the memory 120 waits for other control commands CNT (such as a write command or a read command) or a refresh command from the memory controller 110. When the memory 120 receives a refresh command (step S403), steps S411~S416 are implemented. In the embodiments, after implementing the step S415, the memory 120 returns to an idle mode (step S402) again.

When the memory 120 receives a refresh command from the memory controller 110, the memory 120 first reads the first refresh value $VU_{RFR}$ (step S411), and retrieves a corresponding access address. Then, the memory 120 determines that the received refresh command is a valid-data refresh command or an invalid-data refresh command (step S412). When the received refresh command is a valid-data refresh command, the memory 120 first sets the corresponding bit in the first data table 123 as valid ("1") (step S416) according to the access address, and then refreshes the specific memory block corresponding to the access address (step S413). When the received refresh command is an invalid-data refresh command, the memory 120 sets the corresponding bit in the first data table 123 as invalid ("0") (step S414) according to the access address. Then, the first refresh value $VU_{RFR}$ is updated (step S415) to select other memory blocks when the memory 120 receives the next refresh command. After updating the first refresh value $VU_{RFR}$, the memory 120 returns to an idle mode (step S402) again. When the memory 120 receives non-refresh commands, the setting of the corresponding bit in the first data table 123 does not change, and the memory 120 returns directly to an idle mode (step S402).

One difference between FIG. 3 and FIG. 4 is that the timing for the memory 120 to set the corresponding bit in the first data table 123 as valid ("1"). In FIG. 3, the memory 120 directly set the corresponding bit in the first data table 123 as valid ("1") according to the access when receiving a write command. However, in FIG. 4, the memory 120 sets the corresponding bit in the first data table 123 as valid ("1") according to the access address after receiving a valid-data refresh command. Both control methods disclosed in FIG. 3 and FIG. 4 can achieve the synchronization between the second data table 113 of the memory controller 110 and the first data table 123 of the memory 120.

By applying the control methods described above, the memory controller 110 and the memory 120 have coherent refresh information between the second storage circuit 111 and the first storage circuit 121. When the memory controller 110 meets a refresh request and selects a specific memory block which does not store any data or stores invalid data, the memory 120 does not refresh the specific memory block. Therefore, the memory controller 110 can immediately sends out other control commands, and the memory 120 can immediately receive and implement other control commands. Because the memory controller 110 does not need to wait for the invalid-data refresh of the memory 120, the performance of the memory controller 110 may increase. Furthermore, the memory 120 does not need to refresh every memory block, so the performance of the memory 120 may increase as well.

According to the memory device disclosed above, when the memory receives a valid-data refresh command from the memory controller, the memory starts to perform a refresh operation; when the memory receives an invalid-data refresh command from the memory controller, the memory sets the corresponding bit in the first data table as invalid according the access address.

According to the memory device disclosed above, the memory controller responds to a write command, sets the corresponding bit in the second data table as valid according to the write address, and sends the write command to the memory. After receiving the write command, the memory sets the corresponding bit in the first data table as valid according to the write address, and writes the specific memory block.

According to the memory device disclosed above, the memory controller responds to a write command, sets the corresponding bit in the second data table as valid according to the write address, and sends the write command to the memory. After receiving the write command, the memory writes the specific memory block according to the write address.

According to the memory device disclosed above, when the memory receives a valid-data refresh command from the memory controller, the memory sets the corresponding bit in the first data table as valid according to the access address.

According to the memory device disclosed above, the memory controller responds to a read command, sends the read command to the memory, and does not change the second data table. After receiving the read command, the memory reads the specific memory block according to the read address, and does not change the first data table.

According to the memory device disclosed above, the memory controller responds to an eviction command, and sets the corresponding bit in the second data table as invalid according to the eviction address. When the memory receives an invalid-data refresh command from the memory controller, the memory sets the corresponding bit in the first data table as invalid according to the access address.

According to the memory device disclosed above, the memory controller responds to a flush command, sets the corresponding bit in the second data table as invalid according to the flush address, and sends a read command to the memory. After receiving the read command, the memory reads data in the memory block according to the flush address, so that the data can be written back to an external storage device. When the memory receives an invalid-data refresh command from the memory controller, the memory sets the corresponding bit in the first data table as invalid according to the access address.

The control method disclosed above further comprises operations performed by the memory. Upon receiving a valid-data refresh command from the memory controller, the memory starts to refresh. Upon receiving an invalid-data refresh command from the memory controller, the memory sets the corresponding bit in the first data table as invalid according to the access address.

According to the control method disclosed above, the memory controller responds to a write command, sets the corresponding bit in the second data table as valid according to the write address, and sends the write command to the memory. After receiving the write command, the memory sets the corresponding bit in the first data table as valid according to the write address, and writes the specific memory block according to the write address.

According to the control method disclosed above, the memory controller responds to a write command, sets the corresponding bit in the second data table as valid according to the write address, and sends the write command to the memory. After receiving the write command, the memory writes the specific memory block according to the write address.

According to the control method disclosed above, when the memory receives a valid-data refresh command from the memory controller, the memory sets the corresponding bit in the first data table as valid according to the access address.

According to the control method disclosed above, the memory controller responds to a read command, sends the read command to the memory, and does not change the second data table. After receiving the read command, the memory reads the specific memory block according to the read address, and does not change the first data table.

According to the control method disclosed above, the memory controller responds to an eviction command, and sets the corresponding bit in the second data table as invalid according to the eviction address. When the memory receives an invalid-data refresh command from the memory controller, the memory sets the corresponding bit in the first data table as invalid according to the access address.

According to the control method disclosed above, the memory controller responds to a flush command, sets the corresponding bit in the second data table as invalid according to the flush address, and sends a read command to the memory. After receiving the read command, the memory reads data in the memory block according to the flush address, so that the data can be written back to an external storage device. When the memory receives an invalid-data refresh command from the memory controller, the memory sets the corresponding bit in the first data table as invalid according to the access address.

The ordinal in the specification and the claims of the present invention, such as "first", "second", "third", etc., has no sequential relationship, and is just for distinguishing between two different devices with the same name. In the specification of the present invention, the word "couple" refers to any kind of direct or indirect electronic connection. The present invention is disclosed in the preferred embodiments as described above, however, the breadth and scope of the present invention should not be limited by any of the embodiments described above. Persons skilled in the art can make small changes and retouches without departing from the spirit and scope of the invention. The scope of the invention should be defined in accordance with the following claims and their equivalents.

What is claimed is:

1. A memory device, comprising:
   a memory, having a plurality of memory blocks and a first storage circuit, the first storage circuit storing a first data table and a first refresh value; and
   a memory controller, having a second storage circuit to store a second data table and a second refresh value;
   wherein the first refresh value and the second refresh value correspond to an access address at which the memory controller triggers the memory to refresh its data when meeting a refresh request, and the access address corresponds to a specific memory block among the plurality of memory blocks;
   wherein the first data table and the second data table both have a plurality of bits, each of the plurality of bits represents whether the corresponding memory block stores valid data or not;
   when the memory controller meets a refresh request, the memory controller reads the second refresh value and compares the corresponding access address to the corresponding bit in the second data table to determine whether the specific memory block of the memory stores the valid data; when the valid data are stored in the specific memory block, the memory controller sends a valid-data refresh command to the memory; when invalid data are stored in the specific memory block, the memory controller sends an invalid-data refresh command to the memory.

2. The memory device as claimed in claim 1, wherein, when the memory receives a valid-data refresh command from the memory controller, the memory starts to perform a refresh operation; when the memory receives an invalid-data refresh command from the memory controller, the memory sets the corresponding bit in the first data table as invalid according to the access address.

3. The memory device as claimed in claim 1, wherein,
   the memory controller responds to a write command, sets the corresponding bit in the second data table as valid according to the write address, and sends the write command to the memory;
   after receiving the write command, the memory sets the corresponding bit in the first data table as valid according to the write address, and writes the specific memory block.

4. The memory device as claimed in claim 1, wherein,
   the memory controller responds to a write command, sets the corresponding bit in the second data table as valid according to the write address, and sends the write command to the memory;
   after receiving the write command, the memory writes the specific memory block according to the write address.

5. The memory device as claimed in claim 4, further comprising:
when the memory receives a valid-data refresh command from the memory controller, the memory sets the corresponding bit in the first data table as valid according to the access address.

6. The memory device as claimed in claim 1, wherein,
the memory controller responds to a read command, sends the read command to the memory, and does not change the second data table;
after receiving the read command, the memory reads the specific memory block according to the read address, and does not change the first data table.

7. The memory device as claimed in claim 1, wherein,
the memory controller responds to an eviction command, and sets the corresponding bit in the second data table as invalid according to the eviction address;
when the memory receives an invalid-data refresh command from the memory controller, the memory sets the corresponding bit in the first data table as invalid according to the access address.

8. The memory device as claimed in claim 1, wherein,
the memory controller responds to a flush command, sets the corresponding bit in the second data table as invalid according to the flush address, and sends a read command to the memory;
after receiving the read command, the memory reads data in the memory block according to the flush address, so that the data can be written back to an external storage device;
when the memory receives an invalid-data refresh command from the memory controller, the memory sets the corresponding bit in the first data table as invalid according to the access address.

9. A memory device control method to synchronize a first data table in a memory and a second data table in a memory controller; the memory has a plurality of memory blocks and a first storage circuit which stores a first data table and a first refresh value; and the memory controller has a second storage circuit which stores a second data table and a second refresh value; wherein the first refresh value and the second refresh value correspond to an access address at which the memory controller triggers the memory to refresh its data when meeting a refresh request, and the access address corresponds to a specific memory block among the plurality of memory blocks; wherein the first data table and the second data table both have a plurality of bits, and each of the plurality of bits represents whether the corresponding memory block stores valid data or not;
the method comprising operations performed by the memory controller:
reading the second refresh value and comparing the corresponding access address to the corresponding bit in the second data table to determine whether the specific memory block of the memory stores the valid data when the memory controller meets a refresh request;
sending a valid-data refresh command to the memory when the valid data are stored in the specific memory block; and
sending an invalid-data refresh command to the memory when invalid data are stored in the specific memory block.

10. The control method as claimed in claim 9, wherein, the method further comprises operations performed by the memory:
when receiving a valid-data refresh command from the memory controller, the memory starts to refresh;
when receiving an invalid-data refresh command from the memory controller, the memory sets the corresponding bit in the first data table as invalid according to the access address.

11. The control method as claimed in claim 9, wherein,
the memory controller responds to a write command, sets the corresponding bit in the second data table as valid according to the write address, and sends the write command to the memory;
after receiving the write command, the memory sets the corresponding bit in the first data table as valid according to the write address, and writes the specific memory block according to the write address.

12. The control method as claimed in claim 9, wherein,
the memory controller responds to a write command, sets the corresponding bit in the second data table as valid according to the write address, and sends the write command to the memory;
after receiving the write command, the memory writes the specific memory block according to the write address.

13. The control method as claimed in claim 12, further comprising:
when the memory receives a valid-data refresh command from the memory controller, the memory sets the corresponding bit in the first data table as valid according to the access address.

14. The control method as claimed in claim 9, wherein,
the memory controller responds to a read command, sends the read command to the memory, and does not change the second data table;
after receiving the read command, the memory reads the specific memory block according to the read address, and does not change the first data table.

15. The control method as claimed in claim 9, wherein,
the memory controller responds to an eviction command, and sets the corresponding bit in the second data table as invalid according to the eviction address;
when the memory receives an invalid-data refresh command from the memory controller, the memory sets the corresponding bit in the first data table as invalid according to the access address.

16. The control method as claimed in claim 9, wherein,
the memory controller responds to a flush command, sets the corresponding bit in the second data table as invalid according to the flush address, and sends a read command to the memory;
after receiving the read command, the memory reads data in the memory block according to the flush address, so that the data can be written back to an external storage device;
when the memory receives an invalid-data refresh command from the memory controller, the memory sets the corresponding bit in the first data table as invalid according to the access address.

* * * * *